United States Patent
Kim et al.

(10) Patent No.: US 10,726,924 B2
(45) Date of Patent: Jul. 28, 2020

(54) SEMICONDUCTOR MEMORY DEVICE

(71) Applicant: SK hynix Inc., Gyeonggi-do (KR)

(72) Inventors: Dong-Hyuk Kim, Seoul (KR); Sung-Lae Oh, Chungcheongbuk-do (KR); Soo-Nam Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/220,756

(22) Filed: Dec. 14, 2018

(65) Prior Publication Data
US 2020/0105348 A1      Apr. 2, 2020

(30) Foreign Application Priority Data

Sep. 28, 2018   (KR) .................... 10-2018-0115531

(51) Int. Cl.
| *G11C 16/24*   | (2006.01) |
| *G11C 16/08*   | (2006.01) |
| *H01L 27/11582* | (2017.01) |
| *H01L 27/11521* | (2017.01) |

(52) U.S. Cl.
CPC .............. *G11C 16/24* (2013.01); *G11C 16/08* (2013.01); *H01L 27/11521* (2013.01); *H01L 27/11582* (2013.01)

(58) Field of Classification Search
CPC .................................. G11C 16/10; G11C 16/26
USPC .......................................... 365/185.13, 185.24
See application file for complete search history.

(56) References Cited

U.S. PATENT DOCUMENTS

| 9,478,259 | B1* | 10/2016 | Yeh ..................... G11C 5/063 |
| 2016/0163732 | A1* | 6/2016 | Lim ................. H01L 27/11582 257/314 |
| 2016/0204111 | A1* | 7/2016 | Park .................... H01L 23/3171 257/324 |
| 2017/0011802 | A1* | 1/2017 | Maeda ................... G11C 16/14 |
| 2017/0062330 | A1* | 3/2017 | Kim ................... H01L 23/5226 |
| 2017/0092371 | A1* | 3/2017 | Harari ................ G11C 16/3431 |
| 2017/0133397 | A1* | 5/2017 | Lee .................. H01L 27/11582 |
| 2017/0207238 | A1* | 7/2017 | Lee .................. H01L 27/11565 |
| 2018/0114794 | A1* | 4/2018 | Jang ..................... H01L 27/1157 |
| 2020/0098434 | A1* | 3/2020 | Lang ................ H01L 27/11565 |
| 2020/0110547 | A1* | 4/2020 | Lee ....................... G06F 3/0659 |
| 2020/0111535 | A1* | 4/2020 | Han ....................... G11C 16/08 |
| 2020/0111810 | A1* | 4/2020 | Tagami ................... H01L 24/04 |

FOREIGN PATENT DOCUMENTS

| KR | 1020160069903 | 6/2016 |
| KR | 1020180001296 | 1/2018 |

* cited by examiner

*Primary Examiner* — Michael T Tran
(74) *Attorney, Agent, or Firm* — IP & T Group LLP (57) ABSTRACT

A semiconductor memory device includes a plurality of bit lines electrically coupled to a memory cell array and extending in a first direction; bit line contact pads formed on a first plane over a substrate and respectively coupled to the bit lines through bit line contacts; and first contact pads formed on the first plane, respectively coupled to the bit line contact pads through redistribution lines, and electrically coupled to a page buffer circuit which is disposed on the substrate, through first contacts, wherein at least two first contact pads corresponding to at least two bit line contact pads which are disposed in a line in a second direction crossing with the first direction are disposed in a line in the first direction.

20 Claims, 11 Drawing Sheets

SEMICONDUCTOR MEMORY DEVICE

CROSS-REFERENCE TO RELATED APPLICATION

The present application claims priority to Korean Patent Application No. 10-2018-0115531 filed in the Korean Intellectual Property Office on Sep. 28, 2018, which is incorporated herein by reference in its entirety.

BACKGROUND

1. Technical Field

Various embodiments of the present disclosure generally relate to a semiconductor memory device. Particularly, the embodiments relate to a wiring structure of a semiconductor memory device.

2. Related Art

In recent years, the demand has been increasing for large capacity and high integration semiconductor memory device in accordance with multifunctionality of an information communication device. As a result, the structures of logic circuits and wiring lines included in the semiconductor memory device for the operation and electrical coupling of the semiconductor memory device have become more complex. Accordingly, a semiconductor memory device having excellent electrical characteristics is required.

SUMMARY

In an embodiment of the present invention, a semiconductor memory device is provided which may include: a plurality of bit lines electrically coupled to a memory cell array and extending in a first direction; bit line contact pads formed on a first plane over a substrate and respectively coupled to the bit lines through bit line contacts; and first contact pads formed on the first plane, respectively coupled to the bit line contact pads through redistribution lines, and electrically coupled to a page buffer circuit which is disposed on the substrate, through first contacts. At least two first contact pads corresponding to at least two-bit line contact pads which are disposed in a line in a second direction crossing with the first direction may be disposed in a line in the first direction.

According to another embodiment of the present invention, a semiconductor memory device may include: a plurality of bit lines electrically coupled to a memory cell array and extending in a first direction; bit line contact pads formed on a first plane over a substrate and respectively coupled to the bit lines through bit line contacts; and first contact pads formed on the first plane, respectively coupled to the bit line contact pads through redistribution lines, and electrically coupled to a page buffer circuit which is disposed on the substrate, through first contacts. A distance between first contact pads which are disposed in a line in a second direction crossing with the first direction may be larger than a distance between bit line contact pads which are disposed in a line in the second direction.

In yet another embodiment of the present invention, a semiconductor memory device may include: a memory cell array; a plurality of bit lines disposed over the memory cell array and extending in a first direction; a page buffer circuit disposed on a substrate below the memory cell array, and coupled to the memory cell array through the bit lines; and a plurality of coupling lines formed on a first plane between the page buffer circuit and the memory cell array, and electrically coupling the page buffer circuit and the bit lines. Each of the coupling lines may include a bit line contact pad which is coupled to a corresponding bit line through a bit line contact and a first contact pad which is coupled to the bit line contact pad through a redistribution line, and at least two first contact pads corresponding to at least two bit line contact pads which are disposed in a line in a second direction crossing with the first direction may be disposed in a line in the first direction.

These and other features and advantages of the present invention will become apparent to the skilled person from the following detailed description with reference to the accompanying drawings.

DETAILED DESCRIPTION

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, a semiconductor memory device will be described below with reference to the accompanying drawings through various examples of embodiments.

Figure 1:
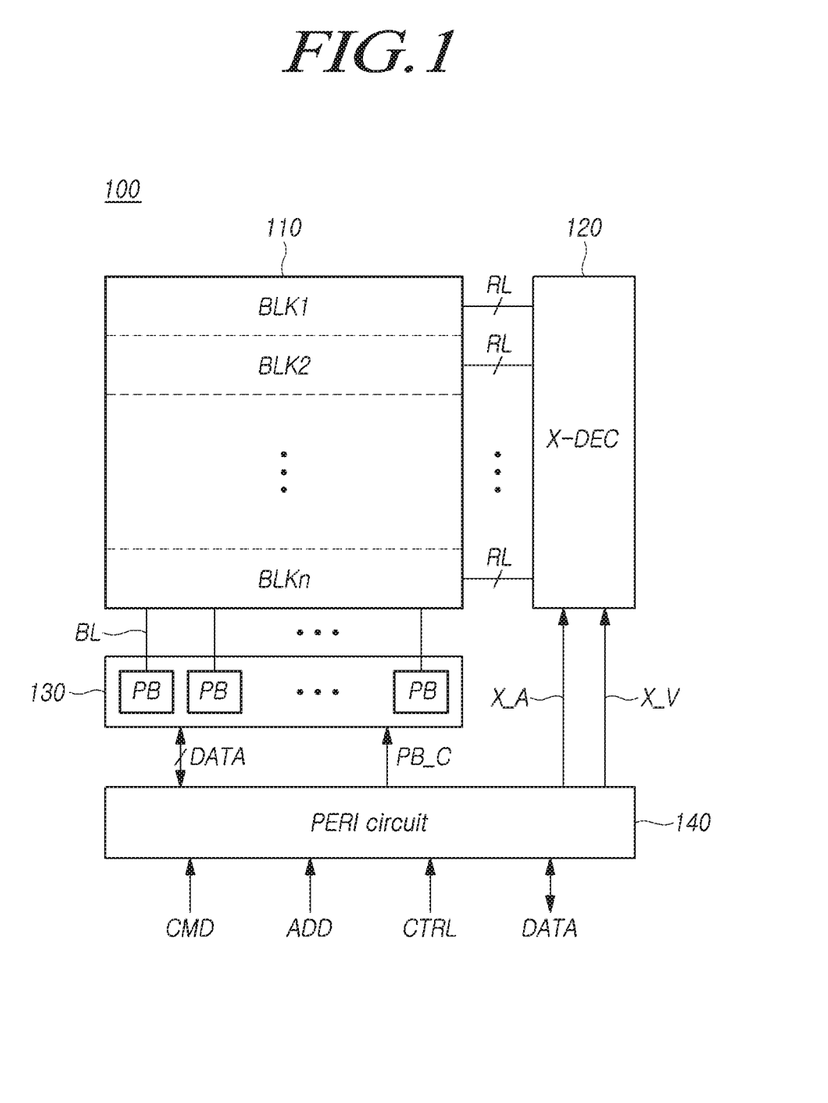
FIG. 1 is a block diagram illustrating an example of a semiconductor memory device in accordance with an embodiment.

FIG. 1 is a block diagram illustrating an example of a semiconductor memory device in accordance with an embodiment.

Referring to FIG. 1, a semiconductor memory device 100 in accordance with an embodiment may include a memory cell array 110, a row decoder 120, a page buffer circuit 130 and a peripheral circuit 140.

The memory cell array 110 may include a plurality of memory blocks BLK1 to BLKn. The memory blocks BLK1 to BLKn may include a plurality of memory cells. Each memory cell may be accessed by a row line RL and a bit line BL. Each memory cell may be a volatile memory cell which loses data stored therein in the case where power supply is interrupted, or may be a nonvolatile memory cell which retains data stored therein even though power supply is interrupted. While it is described below that the semiconductor memory device 100 is a vertical NAND flash device, it is to be understood that the technical spirit of the present disclosure is not limited thereto.

The row decoder 120 may be coupled to the memory cell array 110 through row lines RL. The row lines RL may include at least one drain select line, a plurality of word lines and at least one source select line. The row decoder 120 may select one among the memory blocks BLK1 to BLKn of the memory cell array 110 depending on a row address X_A. The row decoder 120 may transfer an operating voltage X_V from the peripheral circuit 140, for example, a program voltage (Vpgm), a pass voltage (Vpass) and a read voltage (Vread), to row lines RL which are coupled to a selected memory block.

The page buffer circuit 130 may be coupled to the memory cell array 110 through bit lines BL. The page buffer circuit 130 may include a plurality of page buffers PB which are respectively coupled to the bit lines BL. The page buffer circuit 130 may receive a page buffer control signal PB_C from the peripheral circuit 140, and may transmit and receive a data signal DATA to and from the peripheral circuit 140. The page buffer circuit 130 may control a bit line BL which is coupled to the memory cell array 110, in response to the page buffer control signal PB_C. For example, the page buffer circuit 130 may detect data stored in a memory cell of the memory cell array 110 by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA received from the peripheral circuit 140 in response to the page buffer control signal PB_C, and thereby, may write data in a memory cell of the memory cell array 110. The page buffer circuit 130 may write data in or read data from a memory cell which is coupled to a word line to be activated by the row decoder 120.

The peripheral circuit 140 may receive a command signal CMD, an address signal ADD and a control signal CTRL from outside the semiconductor memory device 100, and may transmit and receive data DATA to and from outside the semiconductor memory device 100. The peripheral circuit 140 may output signals for writing data DATA in the memory cell array 110 or reading data DATA from the memory cell array 110, for example, the row address X_A, the page buffer control signal PB_C and so forth, based on the command signal CMD, the address signal ADD and the control signal CTRL. The peripheral circuit 140 may generate various voltages including the operating voltage X_V, which are required in the semiconductor memory device 100.

Hereinbelow, in the accompanying drawings, two directions that are parallel to the top surface of a substrate and intersect with each other are defined as a first direction FD and a second direction SD, respectively, and a direction that vertically projects from the top surface of the substrate is defined as a third direction TD. The first direction FD may correspond to the extending direction of bit lines or/and the arrangement direction of row lines, and the second direction SD may correspond to the extending direction of the row lines or/and the arrangement direction of the bit lines. The first direction FD and the second direction SD may substantially perpendicularly intersect with each other. In the drawings, a direction indicated by an arrow and a direction opposite thereto represent the same direction.

Figure 2:
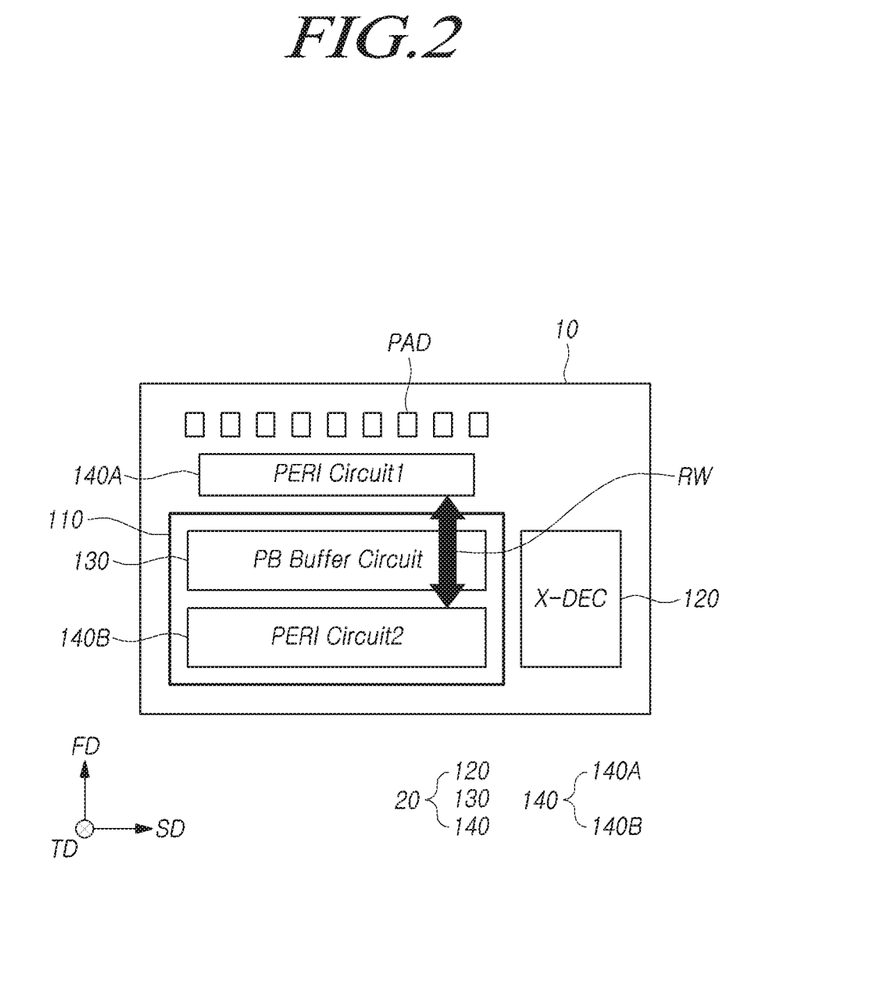
FIG. 2 is a layout diagram schematically illustrating an example of the semiconductor memory device in accordance with the embodiment.
Figure 3:
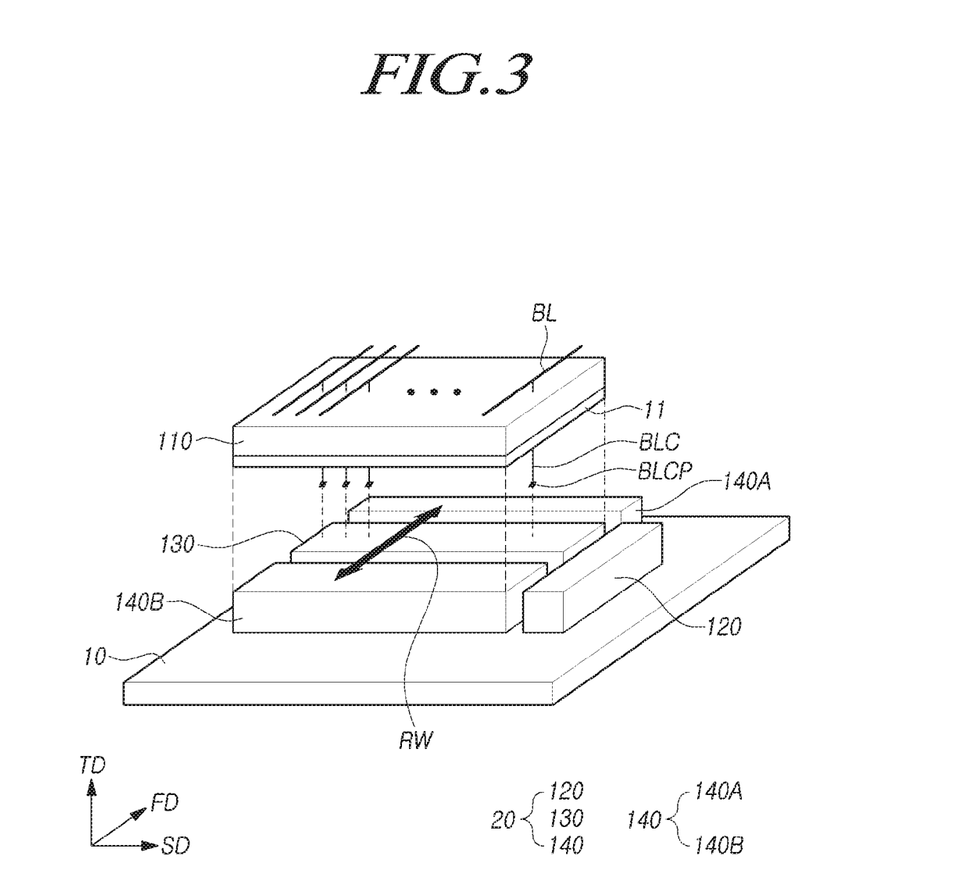
FIG. 3 is a perspective view schematically illustrating an example of the semiconductor memory device in accordance with the embodiment.

FIG. 2 is a layout diagram schematically illustrating a representation of an example of the semiconductor memory device in accordance with the described embodiment. FIG. 3 is a perspective view schematically illustrating a representation of an example of the semiconductor memory device in accordance with the described embodiment.

Referring to FIGS. 2 and 3, a logic circuit 20 may be disposed on a substrate 10, and a memory cell array 110 may be disposed on a source plate 11 over the logic circuit 20.

The substrate 10 may be a semiconductor substrate which has a first type conductivity, for example, the P-type conductivity. The semiconductor substrate may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The source plate 11 may be constructed by a polycrystalline silicon layer.

The logic circuit 20 may include a row decoder 120, a page buffer circuit 130 and a peripheral circuit 140. The row decoder 120 may be disposed adjacent to an edge of the substrate 10 to have a shape which extends in the first direction FD. The first direction FD may be the arrangement direction of row lines RL. The row decoder 120 may have an elongated bar shape which extends in the first direction FD.

The page buffer circuit 130 may be disposed to have a shape which extends in the second direction SD. The second direction SD may be the arrangement direction of bit lines BL. The page buffer circuit 130 may be disposed below the memory cell array 110 to overlap with the memory cell array 110. The page buffer circuit 130 may have an elongated bar shape which extends in the second direction SD.

The peripheral circuit 140 may be disposed at both sides of the page buffer circuit 130 in the first direction FD. Hereinbelow, for the sake of convenience in explanation, a part of the peripheral circuit 140 which is disposed at one side of the page buffer circuit 130 in the first direction FD is defined as a first peripheral circuit 140A, and a part of the peripheral circuit 140 which is disposed at the other side of the page buffer circuit 130 in the first direction FD is defined as a second peripheral circuit 140B. The first peripheral circuit 140A may be electrically coupled to the second peripheral circuit 140B through wiring lines RW which traverse over the page buffer circuit 130 in the first direction FD, and may transfer power and signals to the second peripheral circuit 140B. Thus, in order to improve power and signal transfer characteristics, the number and pitch of the wiring lines RW which are routed in the first direction FD should be secured sufficiently. The first and second peripheral circuits 140A and 140B may be disposed each have an elongated bar shape extending in the second direction.

A plurality of input/output pads PAD may be disposed adjacent to an edge of the substrate 10 in the vicinity of the first peripheral circuit 140A. The input/output pads PAD as external contacts of the semiconductor memory device 100 for electrical coupling with an external device may be electrically coupled with the first peripheral circuit 140A through wiring lines (not shown). The plurality of input/output pads PAD may be spaced apart at a regular interval along the second direction SD.

The bit lines BL may be disposed on the memory cell array 110. The bit lines BL may extend in the first direction FD and be arranged at regular intervals along the second direction SD. The bit lines BL which serve to couple the memory cell array 110 and the page buffer circuit 130 may be electrically coupled with the memory cell array 110 and the page buffer circuit 130. For the sake of simplification in illustration, illustration of the bit lines BL is omitted in FIG. 2.

In order to electrically couple the bit lines BL and the page buffer circuit 130, bit line contact pads BLCP which are electrically coupled to the page buffer circuit 130 may be disposed at one of wiring layers between the page buffer circuit 130 and the source plate 11. The bit lines BL may be coupled to the bit line contact pads BLCP through bit line contacts BLC which pass through the memory cell array 110 and the source plate 11 in the third direction TD.

Figure 4:
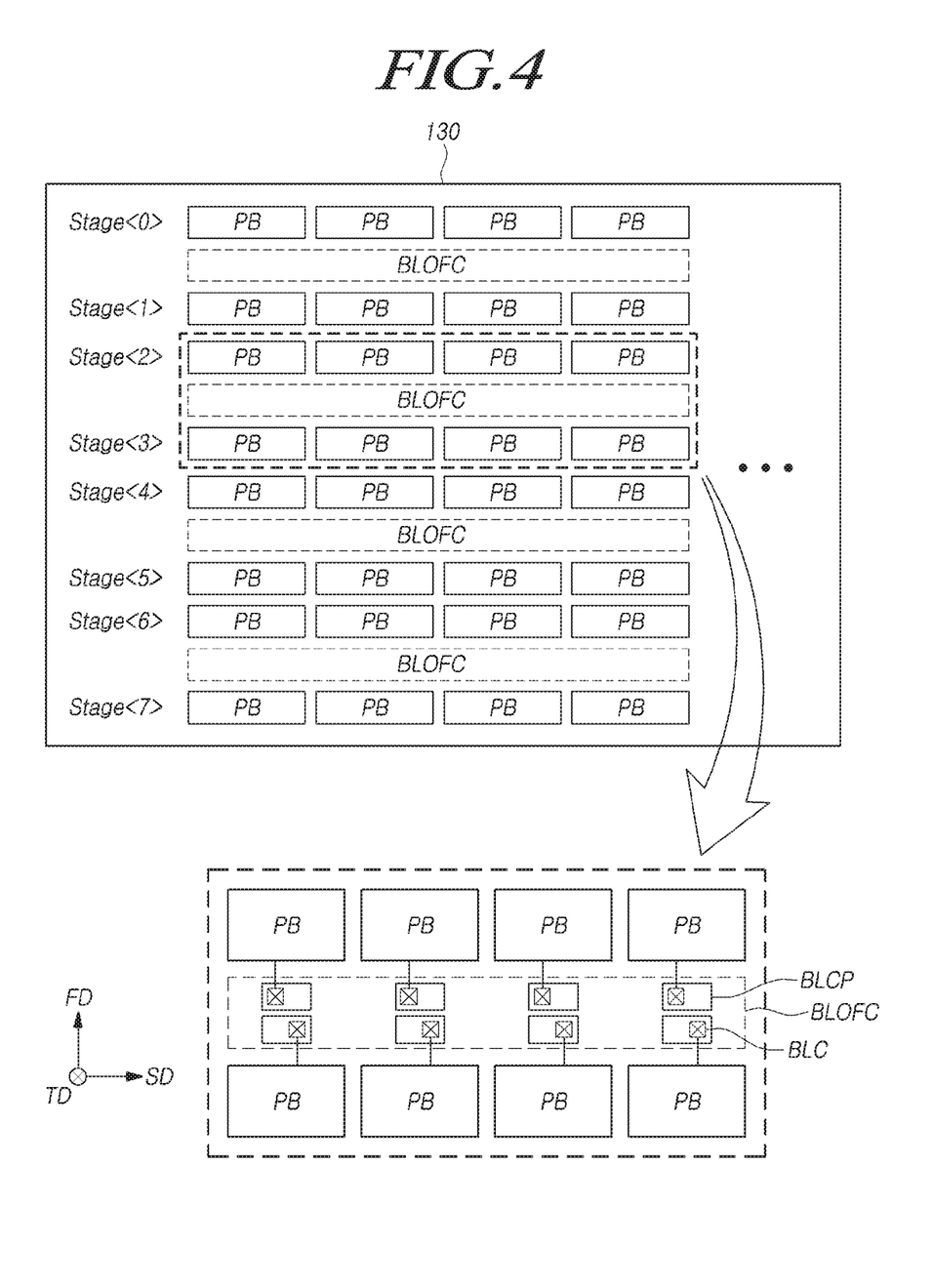
FIG. 4 is a diagram illustrating an example of the schematic layout of the page buffer circuit of FIG. 3.

The bit line contact pads BLCP serving as landing pads on which the bit line contacts BLC are landed are disposed in the second direction SD in correspondence to the arrangement structure of the bit lines BL which are arranged in the second direction SD. FIG. 4 is a diagram illustrating a representation of an example of the schematic layout of the page buffer circuit.

Referring to FIG. 4, page buffers PB of the page buffer circuit 130 may be disposed in the form of a matrix which has eight rows. It may be regarded that such a page buffer circuit 130 is configured by eight stages Stage<0> to Stage<7>. The number of stages of the page buffer circuit 130 may be understood as the number of page buffers PB which are arranged in the first direction FD, that is, the extending direction of the bit lines BL. While it is illustrated in FIG. 4 that the page buffer circuit 130 has eight stages, it is to be noted that the technical spirit of the present disclosure is not limited thereto.

A bit line contact region BLOFC may be disposed between a pair of stages which are disposed adjacent to each other. For example, a bit line contact region BLOFC may be disposed between the stages Stage<0> and Stage<1>, and a bit line contact region BLOFC may be disposed between the stages Stage<2> and Stage<3>. Bit line contact pads BLCP which are coupled to the page buffers PB included in adjacent stages may be disposed in each bit line contact region BLOFC. As described above with reference to FIG. 3, the bit line contact pads BLCP may be disposed along the second direction SD in correspondence to the arrangement structure of the bit lines BL.

In the present embodiment, it is illustrated that the bit line contact pads BLCP are disposed in two lines in the second direction SD. It may be understood that the bit line contact pads BLCP of a first (upper) line are coupled to the page buffers PB of a stage which is positioned at one (upper) side of the bit line contact region BLOFC in the first direction FD and that the bit line contact pads BLCP of a second (lower) line are coupled to the page buffers PB of a stage which is positioned at the other (lower) side of the bit line contact region BLOFC in the first direction FD.

In order to improve power and signal transfer characteristics, it is necessary to secure an adequate number and pitch of the wiring lines (see the reference symbol RW of FIG. 3) which are routed in the first direction FD. In this regard, since a width through which the wiring lines RW may pass through the bit line contact region BLOFC is limited due to the presence of the bit line contact pads BLCP disposed in the bit line contact region BLOFC, it is not easy to secure an adequate number and pitch of the wiring lines RW. The number and pitch of the wiring lines RW may be increased by increasing a layout area. However, in this case, a problem may be caused in that the size of a semiconductor memory device increases.

Embodiments of the present disclosure provide a semiconductor memory device which is capable of overcoming a spatial limitation due to the presence of the bit line contact pads BLCP without causing an increase in the size of a semiconductor memory device and increasing the number and pitch of the wiring lines RW routed in the first direction FD.

Figure 5:
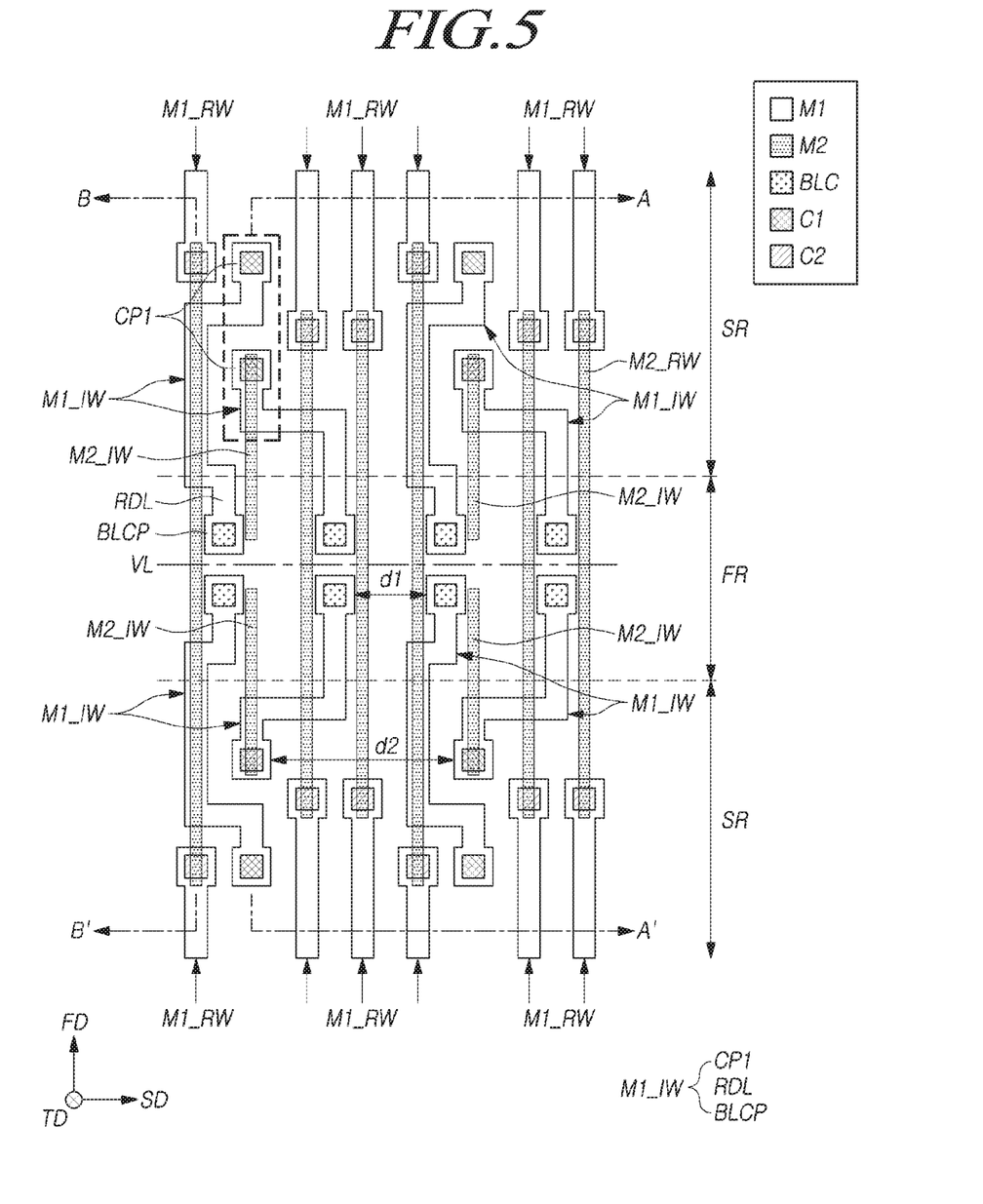
FIG. 5 is a layout diagram illustrating an example of portions of wiring layers of the semiconductor memory device in accordance with the embodiment.
Figure 6:
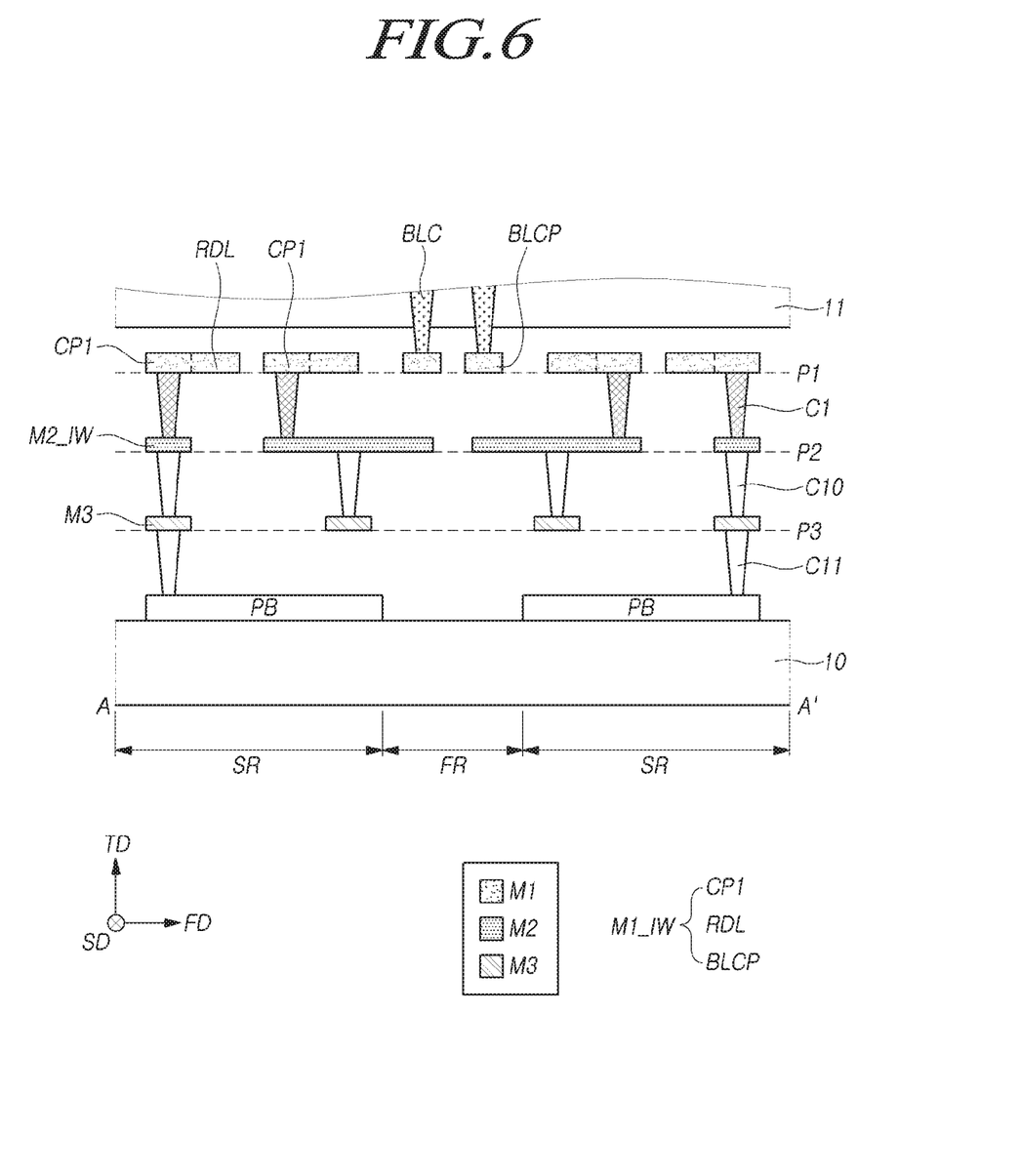
FIG. 6 is a cross-sectional view taken along the line A-A' of FIG. 5.

FIG. 5 is a layout diagram illustrating a representation of an example of portions of wiring layers of the semiconductor memory device in accordance with the described embodiment. FIG. 6 is a cross-sectional view taken along the line A-A' of FIG. 5, and FIG. 7 is a cross-sectional view taken along the line B-B' of FIG. 5.

Figure 7:
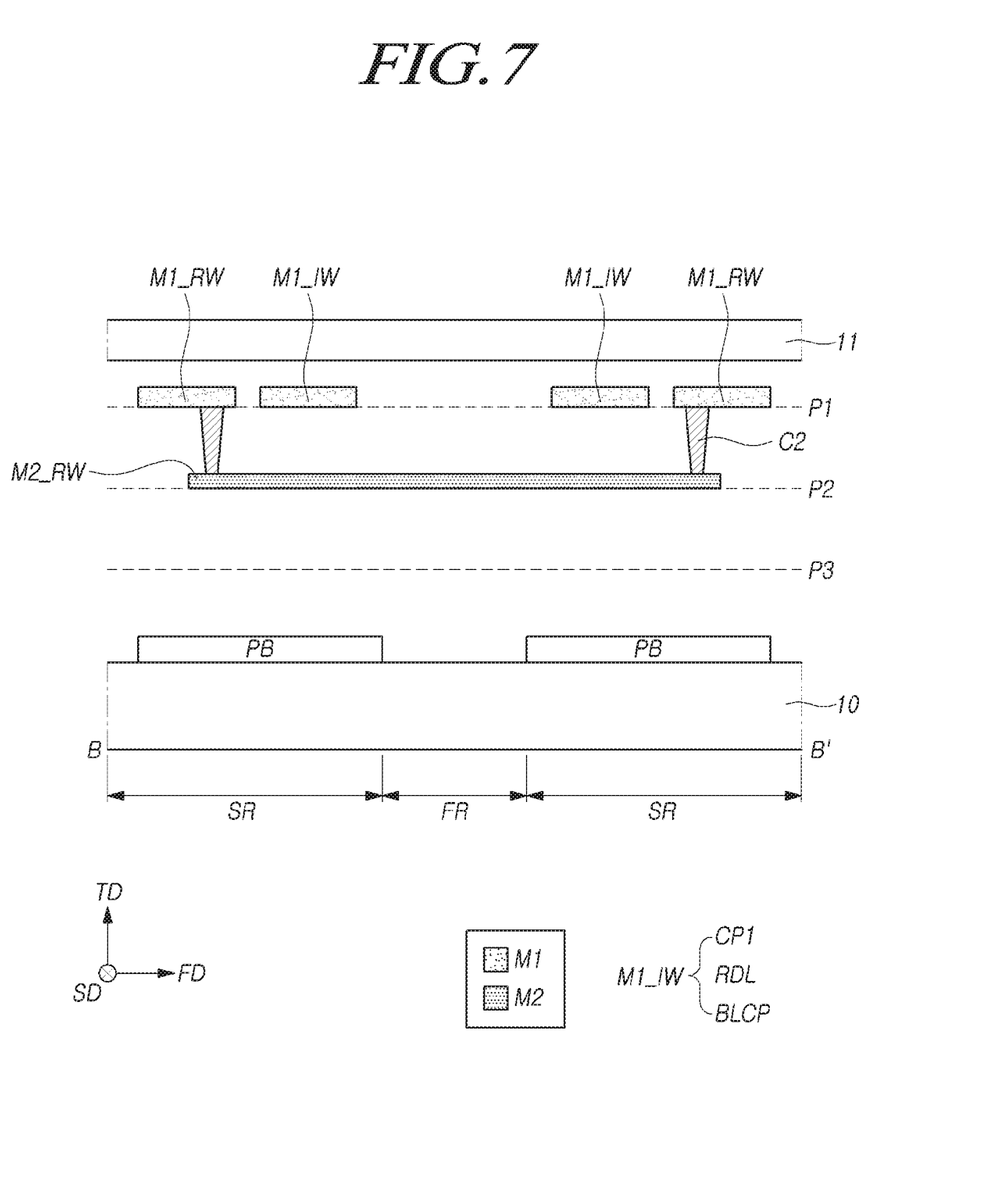
FIG. 7 is a cross-sectional view taken along the line B-B' of FIG. 5.

Referring to FIGS. 5 to 7, first and second regions FR and SR may be defined in a substrate 10. The first region FR may be substantially the same as the bit line contact region BLOFC of FIG. 4. The second region SR may include two regions positioned at both sides of the bit line contact region BLOFC of FIG. 4 in the first direction FD.

Page buffers PB may be disposed on the second region SR of the substrate 10. First conductive lines M1 may be disposed on a first plane P1 below the source plate 11. Second conductive lines M2 may be disposed on a second plane P2 below the first plane P1. The extending directions of the first conductive lines M1 and the second conductive lines M2 may be the same as the first direction FD. The second direction SD may be regarded as the arrangement direction of the first conductive lines M1 and the second conductive lines M2. The first conductive lines M1 may be arranged at a constant pitch in the second direction SD. The pitch of the second conductive lines M2 in the second direction SD may be substantially the same as the pitch of the first conductive lines M1 in the second direction SD.

Third conductive lines M3 may be disposed on a third plane P3 between the second plane P2 and the substrate 10.

For the sake of simplification in illustration, in FIG. 5, the illustration of the page buffers PB, the third plane P3 and the third conductive lines M3 on the third plane P3 is omitted.

Some of the first conductive lines M1 on the first plane P1 may form first coupling lines M1_IW which couple the page buffers PB and bit lines. The remaining of the first conductive lines M1 on the first plane P1 may form first wiring lines M1_RW which configure wiring lines (RW of FIG. 3) routed in the first direction FD.

It may be understood that first coupling lines M1_IW which are disposed at one (upper) side of a virtual line VL traversing the middle portion of the first region FR in the second direction SD are electrically coupled with the page buffers PB of a stage which is positioned at one (upper) side of the first region FR in the first direction FD (see FIG. 4) and first coupling lines M1_IW which are disposed at the other (lower) side of the virtual line VL are electrically coupled with the page buffers PB of a stage which is positioned at the other (lower) side of the first region FR in the first direction FD (see FIG. 4). The first coupling lines M1_IW which are disposed at the one side of the virtual line VL and the first coupling lines M1_IW which are disposed at the other side of the virtual line VL may have mirror type symmetrical structures with respect to the virtual line VL.

Each of the first coupling lines M1_IW may include a bit line contact pad BLCP, a redistribution line RDL and a first contact pad CP1.

Bit line contact pads BLCP serving as the landing pads of bit line contacts BLC may be coupled to the bit lines (not shown) through the bit line contacts BLC. The bit line contact pads BLCP of the first coupling lines M1_IW may be disposed over the first region FR. It may be regarded that bit line contact pads BLCP which are disposed in a line in the second direction SD are coupled to the page buffers PB of the same stage.

The bit line contact pads BLCP may be respectively coupled to the first contact pads CP1 which are disposed over the second region SR, through the redistribution lines RDL. First ends of each of the redistribution lines RDL may be respectively coupled to a corresponding bit line contact pad BLCP over the first region FR, and the other end of each of the redistribution lines RDL may be respectively coupled to a corresponding one of the first contact pads CP1 over the second region SR.

At least two first contact pads CP1 which are coupled to at least two bit line contact pads BLCP disposed in a line in the second direction SD may be disposed in a line in the first direction FD. The bit line contact pads BLCP which are coupled to the first contact pads CP1 disposed in a line in the first direction FD may be disposed adjacent to each other in the second direction SD.

As the first contact pads CP1 have the above-described arrangement structure, the number of the first contact pads CP1 which are disposed in a line in the second direction SD is smaller than the number of bit line contact pads BLCP which are disposed in a line in the second direction SD, and a distance d2 between the first contact pads CP1 which are disposed in a line in the second direction SD is larger than a distance d1 between the bit line contact pads BLCP which are disposed in a line in the second direction SD.

While it is illustrated in FIGS. 5 to 7 that each two of the first contact pads CP1 which are coupled to the bit line contact pads BLCP disposed in a line in the second direction SD are disposed in a line in the first direction FD, it is to be noted that the technical spirit of the present disclosure is not limited thereto.

The first wiring lines M1_RW may be disposed over the second region SR and may have a line shape which extends in the first direction FD. The first wiring lines M1_RW which are disposed over the second region SR at one side of the first region FR and the first wiring lines M1_RW which are disposed over the second region SR at the other side of the first region FR may form pairs. Each pair of first wiring lines M1_RW may be disposed on the same line in the first direction FD. The first wiring lines M1_RW are not disposed on the same lines as the first contact pads CP1 in the first direction FD.

Some of the second conductive lines M2 on the second plane P2 may form second coupling lines M2_IW which couple the page buffers PB and the bit lines. The remaining of the second conductive lines M2 on the second plane P2 may form second wiring lines M2_RW which configure the wiring lines (RW of FIG. 3) routed in the first direction FD.

The second coupling lines M2_IW may be respectively coupled to the first contact pads CP1 of the first coupling lines M1_IW which are formed on the first plane P1, through first contacts C1.

The second wiring lines M2_RW may have a line shape which extends in the first direction FD, and may traverse the first region FR in the first direction FD. Each of the second wiring lines M2_RW may be coupled to a pair of first wiring lines M1_RW which are disposed on the same line in the first direction FD, through second contacts C2. Each pair of first wiring lines M1_RW which are disposed on the same line in the first direction FD may be electrically coupled with each other by each second wiring line M2_RW and the second contacts C2 and thereby configure each wiring line (RW of FIG. 3).

Some of the third conductive lines M3 on the third plane P3 may serve to couple the page buffers PB and the bit lines, may be coupled to the second coupling lines M2_IW which are formed on the second plane P2, through contacts C10, and may be coupled to the page buffers PB which are formed on the substrate 10, through contacts C11.

As described above, since the first contact pads CP1 which are formed on the first plane P1 are coupled to the second coupling lines M2_IW which are formed on the second plane P2, through the first contact C1, the second coupling lines M2_IW may be positioned on the second plane P2 directly below the first contact pads CP1. Therefore, the second wiring lines M2_RW which are formed on the same second plane P2 as the second coupling lines M2_IW may be limited in their positions due to the presence of the first contact pads CP1 and the second coupling lines M2_IW coupled thereto.

Thus, even though the wiring lines RW are configured by using the second wiring lines M2_RW on the second plane P2 below the first plane P1 through avoiding the bit line contact pads BLCP formed on the first plane P1, because the positions of the second wiring lines M2_RW are limited due to the presence of the first contact pads CP1 and the second coupling lines M2_IW coupled thereto, it is still not easy to secure the number and width of the wiring lines RW which are configured by using the second wiring lines M2_RW.

As stated earlier, according to the present embodiment, since at least two first contact pads CP1 which are coupled to at least two bit line contact pads BLCP disposed in a line in the second direction SD are disposed in a line in the first direction FD and accordingly the distance d2 between the first contact pads CP1 disposed in a line in the second direction SD is larger than the distance d1 between the bit line contact pads BLCP disposed in a line in the second direction SD, it is possible to increase the number and width of the second wiring lines M2_RW that are limited due to the presence of the second coupling lines M2_IW positioned directly below the first contact pads CP1. As a consequence, the characteristics of power and signals to be transmitted through the wiring lines RW which are configured by using the second wiring lines M2_RW may be improved.

While it is illustrated in the embodiment described above with reference to FIGS. 2 to 7 that a logic circuit (20 of FIG. 3) is disposed below a memory cell array (110 of FIG. 3), it is to be noted that the technical spirit of the present disclosure is not limited thereto. A memory cell array may be disposed planar to a logic circuit. In this case, it may be regarded that the first plane P1 to the third plane P3 are disposed between the bit lines BL and the substrate 10.

Figure 8:
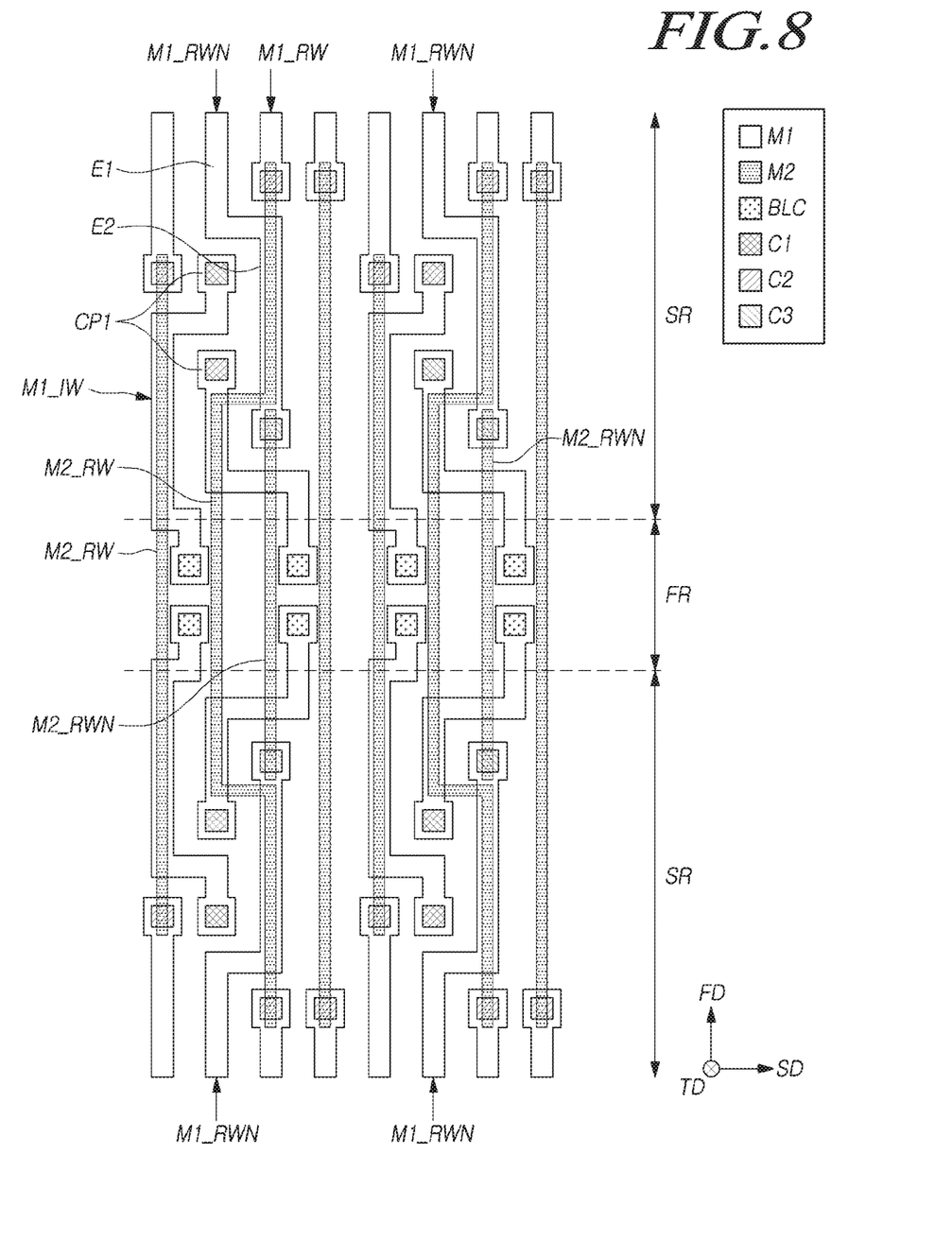
FIG. 8 is a layout diagram illustrating an example of portions of wiring layers of a semiconductor memory device in accordance with an embodiment.

FIG. 8 is a layout diagram illustrating a representation of an example of portions of wiring layers of a semiconductor memory device in accordance with an embodiment.

Referring to FIG. 8, some of first conductive lines M1 on a first plane P1 may form third wiring lines M1_RWN which configure wiring lines (RW of FIG. 3) routed in the first direction FD.

The third wiring lines M1_RWN may be disposed over a second region SR. One end E1 of each of the third wiring lines M1_RWN may be disposed on the same line as first contact pads CP1 which are disposed in a line in the first direction FD. Each of the third wiring lines M1_RWN may be bent for avoiding first coupling lines M1_IW and first wiring lines M1_RW, and the other end E2 of each of the third wiring lines M1_RWN may be disposed at a position that is deviated from the one end E1 in the second direction SD. For example, the other end E2 of each of the third wiring lines M1_RWN may be disposed to be deviated from the one end E1 by a distance corresponding to the pitch of the first conductive lines M1 in the second direction SD.

The third wiring lines M1_RWN which are disposed over the second region SR at one side of a first region FR and the third wiring lines M1_RWN which are disposed over the second region SR at the other side of the first region FR may form pairs, and the other ends E2 of each pair of third wiring lines M1_RWN may be disposed on the same line in the first direction FD.

Some of second conductive lines M2 on a second plane P2 may form fourth wiring lines M2_RWN which configure the wiring lines (RW of FIG. 3). The fourth wiring lines M2_RWN may have a line shape which extends in the first direction FD, and may traverse the first region FR in the first direction FD. Each of the fourth wiring lines M2_RWN may be coupled to the other ends E2 of each pair of third wiring lines M1_RWN which are disposed on the same line in the first direction FD, through third contacts C3. Each pair of third wiring lines M1_RWN may be electrically coupled with each other by each fourth wiring line M2_RWN and the third contacts C3 and thereby configure each wiring line (RW of FIG. 3) routed in the first direction FD.

Figure 9:
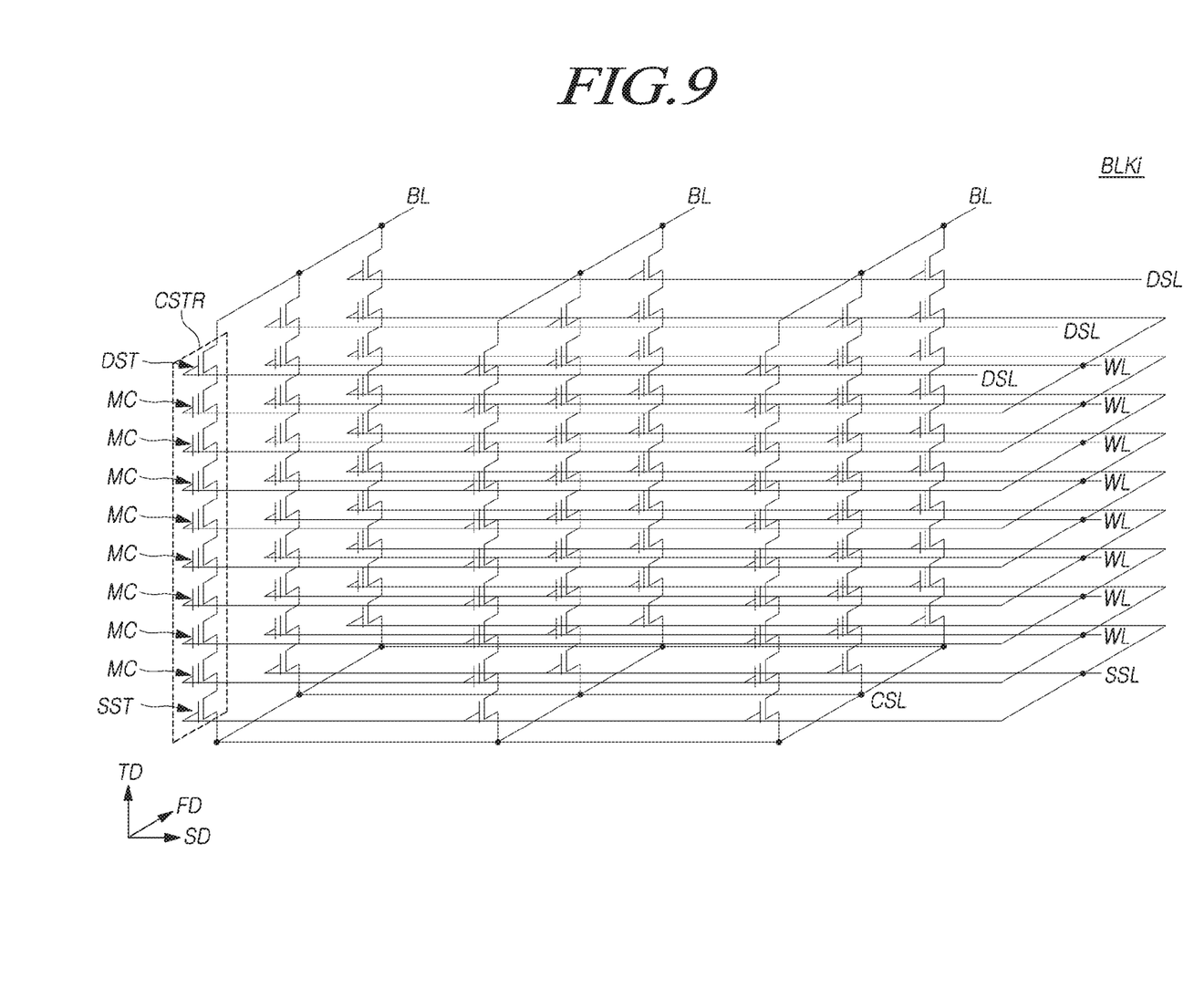
FIG. 9 is a circuit diagram illustrating an example of a portion of the memory cell array shown in FIG. 1.

FIG. 9 is a circuit diagram illustrating a representation of an example of a portion of the memory cell array shown in FIG. 1. FIG. 9 illustrates one memory block BLKi among the memory blocks included in the memory cell array.

Referring to FIG. 9, the memory block BLKi may include a plurality of cell strings CSTR which are coupled between a plurality of bit lines BL and a common source line CSL.

The bit lines BL may extend in the first direction FD and be arranged in the second direction SD. A plurality of cell strings CSTR may be coupled in parallel to each of the bit lines BL. Cell strings CSTR which are disposed in a line in the first direction FD may be coupled to a single bit line BL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL which extend in the second direction SD may be stacked in the third direction TD between the bit lines BL and the common source line CSL. The drain select lines DSL may be respectively coupled to the gates of corresponding drain select transistors DST. The word lines WL may be respectively coupled to the gates of corresponding memory cells MC. The source select line SSL may be coupled to the gates of source select transistors SST.

As is apparent from the above descriptions, according to the embodiments of the present disclosure, it is possible to overcome a spatial limitation due to the presence of bit line contact pads which couple bit lines and a page buffer circuit, and it is possible to increase the number of wiring lines to be disposed within the same layout area. Therefore, because it is not necessary to increase a layout area for the disposition of wiring lines, it is possible to suppress the size of a semiconductor memory device from increasing.

According to the embodiments of the present disclosure, since it is possible to overcome a spatial limitation due to the presence of bit line contact pads and increase the number and pitch of wiring lines, capability for transmitting power and signals may be enhanced, and thereby, it is possible to improve the electrical characteristics of a semiconductor memory device.

Figure 10:
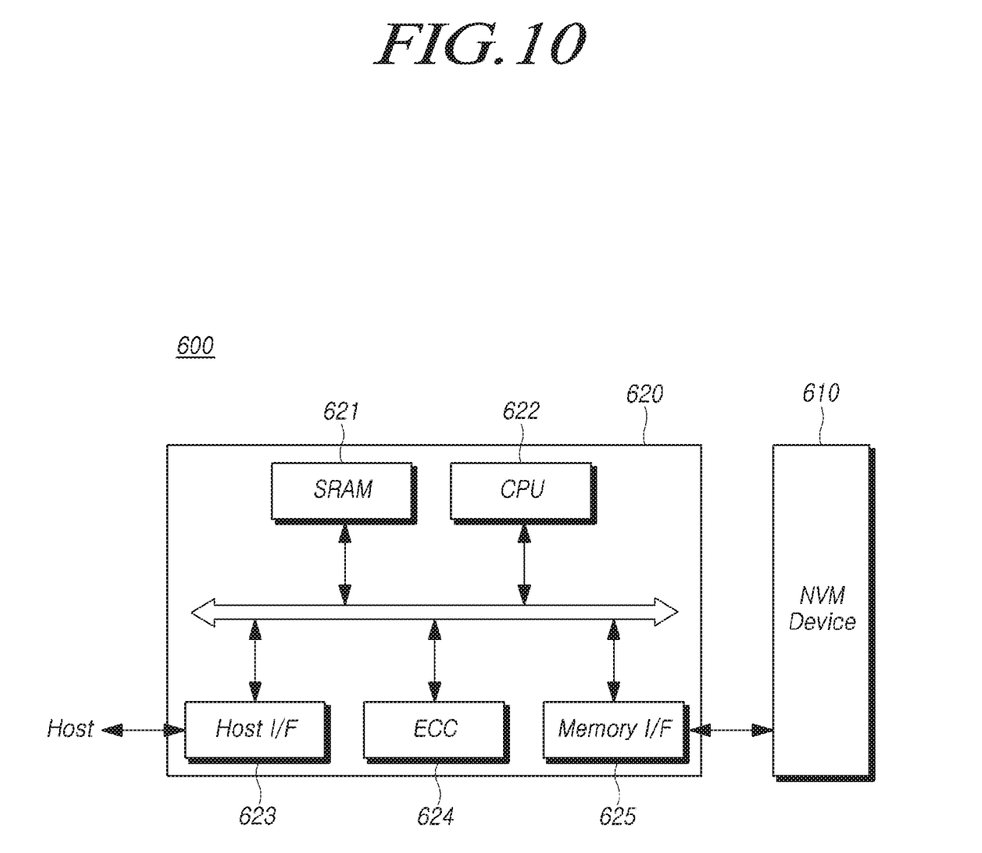
FIG. 10 is a simplified block diagram schematically illustrating a memory system including a semiconductor memory device in accordance with an embodiment.

FIG. 10 is a simplified block diagram schematically illustrating a memory system including a semiconductor memory device according to an embodiment of the present invention.

Referring to FIG. 10, the memory system 600 may include the semiconductor memory device 610 and a memory controller 620.

The semiconductor memory device 610 may comprise the semiconductor memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid-state disk (SSD). The memory controller 620 may include an SRAM 621, a central processing unit (CPU) 622, a host interface 623, an error correction circuit (ECC) block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid-state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 11:
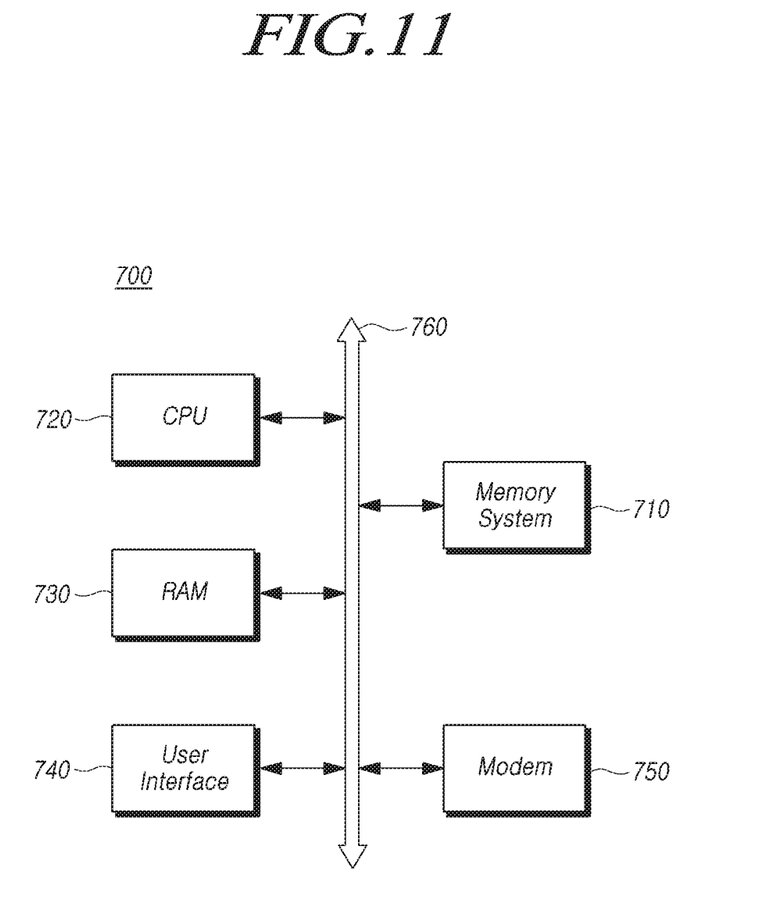
FIG. 11 is a block diagram schematically illustrating a representation of an example of a computing system including a semiconductor memory device in accordance with an embodiment.

FIG. 11 is a simplified block diagram schematically illustrating a computing system including a semiconductor memory device, according to an embodiment of the present invention.

Referring to FIG. 11, a computing system 700 according to an embodiment may include a memory system 710, a microprocessor (or CPU) 720, a RAM 730, a user interface 740, a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid-state drive/disk) which uses a nonvolatile memory to store data. Also, as an example, the memory system 710 may be provided as a fusion flash memory (for example, a NAND or a NOR flash memory).

It is noted that the above-described embodiments are not realized only by a device and a method, and they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
    a plurality of bit lines electrically coupled to a memory cell array and extending in a first direction;
    bit line contact pads formed on a first plane over a substrate and respectively coupled to the bit lines through bit line contacts; and
    first contact pads formed on the first plane, respectively electrically coupled to the bit line contact pads through redistribution lines, and electrically coupled to a page buffer circuit which is disposed on the substrate, through first contacts,
    wherein at least two first contact pads corresponding to at least two bit line contact pads which are disposed in a line in a second direction crossing with the first direction are disposed in a line in the first direction,
    wherein the first plane is parallel to a top surface of the substrate, and
    wherein the first and the second direction are parallel to the top surface of the substrate.

2. The semiconductor memory device according to claim 1, further comprising:
    second coupling lines disposed on a second plane between the substrate and the first plane, and electrically coupled to the page buffer circuit,
    wherein the bit line contact pads, the redistribution lines and the first contact pads configure first coupling lines, and
    wherein the second coupling lines are coupled to the first coupling lines through the first contacts.

3. The semiconductor memory device according to claim 2, wherein the bit line contact pads are disposed over a first region, and the first contact pads are disposed over a second region which is adjacent to the first region in the first direction.

4. The semiconductor memory device according to claim 3, further comprising:
    first wiring lines disposed on the first plane of the second region; and
    second wiring lines disposed on the second plane, coupled to the first wiring lines through second contacts, and traversing the first region in the first direction.

5. The semiconductor memory device according to claim 4,
    wherein the second region is disposed at both sides of the first region in the first direction,
    wherein the second wiring lines have a line shape which extends in the first direction, and
    wherein each of the second wiring lines is coupled to a pair of first wiring lines which are disposed on the same line in the first direction, through the second contacts.

6. The semiconductor memory device according to claim 4, wherein the first wiring lines are not disposed on the same lines as the first contact pads in the first direction.

7. The semiconductor memory device according to claim 4, further comprising:
    third wiring lines formed on the first plane; and
    fourth wiring lines disposed on the second plane, coupled to the third wiring lines through third contacts, and traversing the first region in the first direction,
    wherein first ends of the third wiring lines are disposed on the same lines as the first contact pads in the first direction.

8. The semiconductor memory device according to claim 7,
    wherein the third wiring lines are bent for avoiding the first coupling lines and the first wiring lines, and
    wherein second ends of the third wiring lines are disposed on the same line as one of the first wiring lines in the first direction.

9. The semiconductor memory device according to claim 8,
wherein the fourth wiring lines have a line shape which extends in the first direction, and
wherein each of the fourth wiring lines is coupled to the second ends of a pair of third wiring lines which are disposed on the same line in the first direction, through the third contacts.

10. The semiconductor memory device according to claim 1,
wherein the memory cell array comprises a plurality of cell strings which are arranged in the first direction and the second direction crossing with the first direction, and
wherein each of the cell strings comprises a plurality of memory cells which are stacked in a direction perpendicular to the substrate.

11. A semiconductor memory device comprising:
a plurality of bit lines electrically coupled to a memory cell array and extending in a first direction;
bit line contact pads formed on a first plane over a substrate and respectively coupled to the bit lines through bit line contacts; and
first contact pads formed on the first plane, respectively coupled to the bit line contact pads through redistribution lines, and electrically coupled to a page buffer circuit which is disposed on the substrate, through first contacts,
wherein a distance between first contact pads which are disposed in a line in a second direction crossing with the first direction is larger than a distance between bit line contact pads which are disposed in a line in the second direction.

12. The semiconductor memory device according to claim 11, wherein the number of first contact pads which are disposed in a line in the second direction is smaller than the number of bit line contact pads which are disposed in a line in the second direction.

13. The semiconductor memory device according to claim 11, wherein the bit line contact pads are disposed over a first region, and the first contact pads are disposed over a second region at both sides of the first region in the first direction.

14. The semiconductor memory device according to claim 13, further comprising:
first wiring lines disposed on the first plane over the second region; and
second wiring lines disposed on a second plane between the substrate and the first plane, coupled to the first wiring lines through second contacts, and traversing the first region in the first direction.

15. The semiconductor memory device according to claim 14, wherein the first wiring lines are not disposed on the same lines as the first contact pads in the first direction.

16. The semiconductor memory device according to claim 11, further including:
third wiring lines formed on the first plane and having first ends which are disposed on the same lines as the first contact pads in the first direction; and
fourth wiring lines disposed on the second plane, coupled to the third wiring lines through third contacts, and traversing the first region in the first direction.

17. The semiconductor memory device according to claim 16,
wherein the bit line contact pads, the redistribution lines and the first contact pads configure first coupling lines, and
wherein the third wiring lines are bent for avoiding the first coupling lines and the first wiring lines, and have second ends disposed on the same line as one of the first wiring lines in the first direction.

18. The semiconductor memory device according to claim 17,
wherein the fourth wiring lines have a line shape which extends in the first direction, and
wherein each of the fourth wiring lines is coupled to the other ends of a pair of third wiring lines which are disposed on the same line in the first direction, through the third contacts.

19. A semiconductor memory device comprising:
a memory cell array;
a plurality of bit lines disposed over the memory cell array and extending in a first direction;
a page buffer circuit disposed on a substrate below the memory cell array, and coupled to the memory cell array through the bit lines; and
a plurality of coupling lines formed on a first plane between the page buffer circuit and the memory cell array, and electrically coupling the page buffer circuit and the bit lines,
wherein each of the coupling lines comprises a bit line contact pad which is coupled to a corresponding bit line through a bit line contact and a first contact pad which is coupled to the bit line contact pad through a redistribution line, and
wherein at least two first contact pads corresponding to at least two bit line contact pads which are disposed in a line in a second direction crossing with the first direction are disposed in a line in the first direction.

20. The semiconductor memory device according to claim 19, wherein a distance between first contact pads which are disposed in a line in a second direction crossing with the first direction is larger than a distance between bit line contact pads which are disposed in a line in the second direction.

* * * * *